(12) United States Patent
Bu

(10) Patent No.: US 10,714,624 B2
(45) Date of Patent: Jul. 14, 2020

(54) THIN-FILM TRANSISTOR FABRICATION METHOD FOR REDUCING SIZE OF THIN-FILM TRANSISTOR AND PIXEL AREA

(71) Applicant: Wuhan China Star Optoelectronics Semiconductor Display Technology Co., Ltd., Wuhan (CN)

(72) Inventor: Chenghao Bu, Wuhan (CN)

(73) Assignee: WUHAN CHINA STAR OPTOELECTRONICS SEMICONDUCTOR DISPLAY TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 16/579,708

(22) Filed: Sep. 23, 2019

(65) Prior Publication Data
US 2020/0020811 A1 Jan. 16, 2020

Related U.S. Application Data

(62) Division of application No. 15/569,388, filed on Oct. 26, 2017, now Pat. No. 10,483,401.

(30) Foreign Application Priority Data

Aug. 28, 2017 (CN) .......................... 2017 1 0752796

(51) Int. Cl.
*H01L 27/11* (2006.01)
*H01L 29/786* (2006.01)
(Continued)

(52) U.S. Cl.
CPC .. *H01L 29/78642* (2013.01); *H01L 29/42384* (2013.01); *H01L 29/45* (2013.01);
(Continued)

(58) Field of Classification Search
CPC . H01L 27/1108; H01L 27/1214; H01L 51/00; H01L 51/0508; H01L 2924/13069
See application file for complete search history.

(56) References Cited

U.S. PATENT DOCUMENTS

| 2018/0033642 A1* | 2/2018 | Lu ........................ C23C 14/0073 |
| 2018/0061870 A1* | 3/2018 | Yang .................... H01L 27/1262 |
| 2018/0315860 A1* | 11/2018 | Lu ........................ H01L 29/7869 |

* cited by examiner

*Primary Examiner* — Hoai V Pham
(74) *Attorney, Agent, or Firm* — Leong C. Lei

(57) ABSTRACT

The present invention provides a thin-film transistor and a fabrication method thereof, and an array substrate. The thin-film transistor includes a separation layer (5) arranged between the source electrode (4) and the drain electrode (6). An oxide semiconductor channel layer (7) is arranged on one side of the separation layer (5) and the drain electrode (6) to contact a portion of an upper surface of the drain electrode (6), a side surface of the drain electrode (6) and the organic separation layer (5), and a portion of an upper surface of the source electrode (4) to serve as a vertical channel, of which a channel length corresponds to a thickness of the separation layer (5). Varying the thickness of the separation layer to reduce the length of the vertical channel to a sub-micrometer order would greatly reduce the size of the thin-film transistor and reduce the area of a pixel. The vertical channel does not cause a short channel effect so as to improve electrical performance of the thin-film transistor. Using a multiple-layered hexagonal boron nitride film to make a moisture/oxygen barrier layer (2) and using a double-layered graphene film to make the source electrode (4) and the drain electrode (6) help significantly improve bending durability of the thin-film transistor.

3 Claims, 9 Drawing Sheets

(51) Int. Cl.
  *H01L 29/45* (2006.01)
  *H01L 29/66* (2006.01)
  *H01L 29/423* (2006.01)
  H01L 21/443 (2006.01)
  H01L 27/12 (2006.01)
(52) U.S. Cl.
  CPC .... *H01L 29/66969* (2013.01); *H01L 29/7869* (2013.01); *H01L 29/78603* (2013.01); *H01L 29/78696* (2013.01); *H01L 21/443* (2013.01); *H01L 27/1218* (2013.01); *H01L 27/1225* (2013.01)

THIN-FILM TRANSISTOR FABRICATION METHOD FOR REDUCING SIZE OF THIN-FILM TRANSISTOR AND PIXEL AREA

CROSS REFERENCE TO RELATED APPLICATION

This is a divisional application of co-pending U.S. patent application Ser. No. 15/569,388, filed on Oct. 26, 2017, which is a national stage of PCT Application No. PCT/CN2017/101973, filed on Sep. 15, 2017, claiming foreign priority of Chinese Patent Application No. 201710752796.X, filed on Aug. 28, 2017.

BACKGROUND OF THE INVENTION

1. Field of the Invention

The present invention relates to the field of display technology, and more particular to a thin-film transistor and a fabrication method thereof and an array substrate.

2. The Related Arts

In the field of display technology, flat panel displays, such as liquid crystal displays (LCDs) and organic light-emitting diode (OLED) displays, have gradually taken the place of cathode ray tube (CRT) displays.

At present, a mainstream LCD is generally made up of a thin-film transistor (TFT) array substrate and a color filter (CF) substrate that are laminated to each other; and liquid crystal is filled between the array substrate and the CF substrate. Electricity is applied to change the direction of liquid crystal molecules in order to refract out light from a backlight module to generate an image.

OLED has various advantages, such as being self-luminous, low drive voltage, high light emission efficiency, short response time, high clarity and contrast, nearly 180° view angle, wide operation temperature range, and being capable of flexible displaying and large-area full-color displaying and is considered in the industry the most promising display device. The OLED also needs an array substrate and the thin-film transistors provided on the array substrate are used as switching components and driving components.

Nowadays, the core technique of the next generation displays relies on design and fabrication of high performance small-size thin film transistors. Particularly, for high definition flexible mobile phone display screens, virtual reality (VR) display screens, augmented reality (AR) display screens, and holographic display screens that are still under development, the most concerned issue is to reduce the area of a pixel and the size of a thin-film transistor.

SUMMARY OF THE INVENTION

An objective of the present invention are to provide a thin-film transistor, which allows for significant reduction of the size of the thin-film transistor and helps reduce a pixel area, and is particularly fit to a high-definition flexible display.

Another objective of the present invention is to provide a thin-film transistor fabrication method, which significantly reduces of the size of a thin-film transistor, helps reduce a pixel area, and is less complicated in a fabrication process thereof.

A further objective of the present invention is to provide an array substrate, in which a thin-film transistor included has a relatively small size and makes an area of a pixel relatively small.

To achieve the above objectives, the present invention first provides a thin-film transistor, which comprises:
a flexible backing;
a moisture/oxygen barrier layer arranged on the flexible backing;
a buffer layer arranged on the moisture/oxygen barrier layer;
a source electrode arranged on the buffer layer;
a separation layer arranged on the source electrode and exposing at least one side portion of the source electrode;
a drain electrode arranged on the separation layer;
an oxide semiconductor channel layer arranged at one side of the separation layer and the drain electrode to sequentially contact a portion of an upper surface of the drain electrode, a side surface of the drain electrode and the organic separation layer, and a portion of an upper surface of the source electrode;
a gate insulation layer arranged on the oxide semiconductor channel layer; and
a gate electrode arranged on the gate insulation layer.

The moisture/oxygen barrier layer comprises a multiple-layered hexagonal boron nitride film; the source electrode and the drain electrode each comprises a double-layered graphene film; the oxide semiconductor channel layer is formed of a material comprising indium oxide, indium gallium zinc oxide, or zinc oxide.

The separation layer is arranged to expose two side portions of the source electrode; a source contact electrode is arranged on one of the side portions of the source electrode that is distant from the oxide semiconductor channel layer; and a drain contact electrode is arranged on one side portion of the drain electrode that is distant from the oxide semiconductor channel layer.

The thin-film transistor further compriss a planarization layer covering the buffer layer, the source electrode, the source contact electrode, the drain electrode, the drain contact electrode, and the gate electrode.

The separation layer is formed of a material that comprises polyimide and has a thickness of 400 nm-800 nm.

The source contact electrode and the drain contact electrode are each formed of a material comprising gold; and the gate electrode is formed of a material comprising aluminum-doped zinc oxide.

The present invention also provides a thin-film transistor fabrication method, which comprises the following steps:
Step S1: providing a glass base plate and forming a flexible backing on the glass base plate;
Step S2: forming a moisture/oxygen barrier layer that is set on and covers the flexible backing;
Step S3: forming a buffer layer that is set on and covers the moisture/oxygen barrier layer;
Step S4: forming a source electrode that is stacked on the buffer layer;
Step S5: forming a separation layer that is stacked on the source electrode and exposes at least one side portion of the source electrode;
Step S6: forming a drain electrode that is set on and covers the separation layer;
Step S7: forming an oxide semiconductor channel layer, a gate insulation layer, and a gate electrode;
wherein the oxide semiconductor channel layer is arranged on one side of the organic separation layer and the drain electrode and sequentially contacts a portion of an upper surface of the drain electrode, a side surface of the drain electrode and the organic separation layer, and a portion of an upper surface of the source electrode; the gate insulation layer is arranged on the oxide semiconductor channel layer and the gate electrode is arranged on the gate insulation layer.

Step S2 comprises a process that comprises first growing a hexagonal boron nitride film on a copper foil and transferring the hexagonal boron nitride film so grown to the flexible backing, wherein the process is repeated multiple times to form the moisture/oxygen barrier layer;

Step S4 comprises a process that comprises first growing a single-layered graphene film on a copper foil and transferring the single-layered graphene film to the buffer layer, wherein the process is repeated twice to form a double-layered graphene film, and subjecting the double-layered graphene film to patterning to form the source electrode; and Step S6 comprises a process that comprises first growing a single-layered graphene film on a copper foil and transferring the single-layered graphene film to the separation layer, wherein the process is repeated twice to form a double-layered graphene film, and subjecting the double-layered graphene film to patterning to form the drain electrode.

Step S7 comprises a process that comprises first depositing an oxide semiconductor film, an insulation material film, and a metal film on the layers that have been formed at completion of Step S6, and subjecting the oxide semiconductor film, the insulation material film, and the metal film to patterning with one single mask so as to form the oxide semiconductor channel layer, the gate insulation layer, and the gate electrode that correspond in shape to each other.

The thin-film transistor fabrication method further comprises:

Step S45, which is carried out between Step S4 and Step S5 to form, through vapor deposition, the source contact electrode on the one side portion of the source electrode;

Step S67, which is carried out between Step S6 and Step S7 to form, through vapor deposition, the drain contact electrode on the side portion of the drain electrode; and Step S8, which deposits a planarization layer on the layers that have been formed at completion of Step S7 and separates the glass base plate and the flexible backing from each other.

The present invention further provides an array substrate, which comprises a number of above-described thin-film transistors, which are arranged in an array.

The efficacy of the present invention is that the present invention provides a the thin-film transistor, which is structured such that a separation layer is arranged between a source electrode and a drain electrode and an oxide semiconductor channel layer is arranged on one side of the separation layer and the drain electrode and sequentially contacts a portion of the upper surface of the drain electrode, a side surface of the drain electrode and the organic separation layer, and a portion of the upper surface of the source electrode to provide a vertical channel, wherein a channel length corresponds to a thickness of the separation layer, so that varying the thickness of the separation layer may reduce the length of the vertical channel to a sub-micrometer order to thereby significantly reduce the size of the thin-film transistor. Since the vertical channel has a relatively small overlapping area with a scan line and a data line, the area of a pixel can be reduced. The vertical channel does not cause short channel effect, allowing for improvement of the electrical performance of the thin-film transistor. Using a multiple-layered hexagonal boron nitride film to make a moisture/oxygen barrier layer and using a double-layered graphene film to make the source electrode and the drain electrode, bending durability of the thin-film transistor can be improved. The present invention provides a thin-film transistor fabrication method, which is implemented to make the above vertical-channel thin-film transistor, so as to significantly reduce the size of the thin-film transistor, reduce an area of a pixel, improve electrical characteristics and bending durability of the thin-film transistor. In addition, one single mask is used to simultaneously form the oxide semiconductor channel layer, the gate insulation layer, and the gate electrode, so that complication of the fabrication process is reduced. The present invention provides an array substrate, which comprises a plurality of above-described vertical-channel thin-film transistors arranged in an array and has a relatively small size, making an area of a pixel relatively small.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
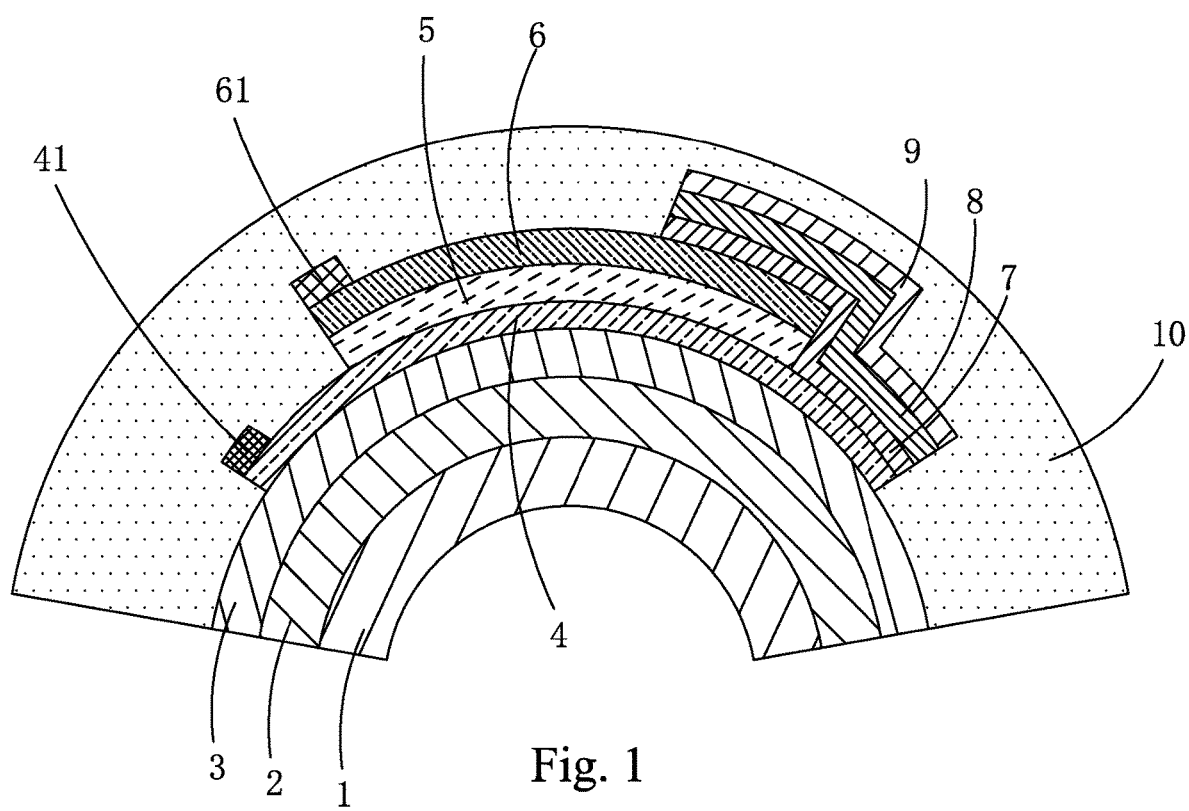
FIG. 1 is a cross-sectional view illustrating a structure of a thin-film transistor according to the present invention in a curved condition.
Figure 2:
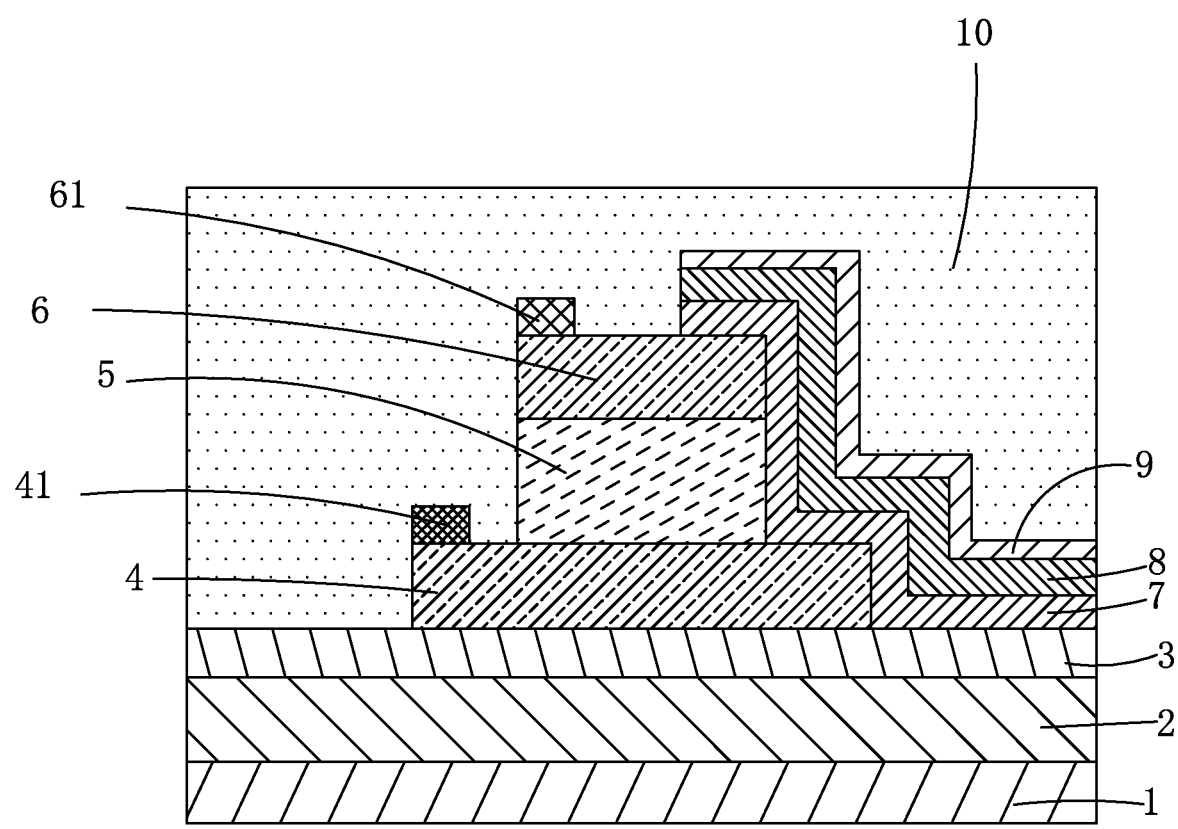
FIG. 2 is a cross-sectional view illustrating a structure of the thin-film transistor according to the present invention in a flat condition.

Referring to both FIGS. 1 and 2, firstly, the present invention provides a thin-film transistor, which comprises:

a flexible backing 1;

a moisture/oxygen barrier layer 2 arranged on the flexible backing 1;

a buffer layer 3 arranged on the moisture/oxygen barrier layer 2;

a source electrode 4 arranged on the buffer layer 3;

a separation layer 5 arranged on the source electrode 4 and exposing at least one side portion of the source electrode 4;

a drain electrode 6 arranged on the separation layer 5;

an oxide semiconductor channel layer 7 arranged at one side of the separation layer 5 and the drain electrode 6 to sequentially contact a portion of an upper surface of the drain electrode 6, a side surface of the drain electrode 6 and the organic separation layer 5, and a portion of an upper surface of the source electrode 4;

a gate insulation layer 8 arranged on the oxide semiconductor channel layer 7 and corresponding, in shape, to the oxide semiconductor channel layer 7;

a gate electrode 9 arranged on the gate insulation layer 8 and corresponding, in shape, to the oxide semiconductor channel layer 7; and a planarization layer 10 set on and covering the buffer layer 3, the source electrode 4, the drain electrode 6, and the gate electrode 9.

Specifically:

the flexible backing 1 is formed of a material that is preferably polyimide (PI);

the moisture/oxygen barrier layer 2 is formed of a two-dimensional planar atomic layer material having multiple layers, such as: a stacked structure of hexagonal boron nitride (h-BN) film, wherein the h-BN film itself shows excellent flexibility and the multiple layers of the h-BN film allows for mutual compensation of point defects so as to form a dense multiple-layered film structure that greatly improves bending durability and moisture/oxygen blocking property of the moisture/oxygen barrier layer 2;

the buffer layer 3 is formed of a material that comprises aluminum oxide ($Al_2O_3$);

the source electrode 4 is preferably a double-layered graphene film;

the separation layer 5 is formed of a material that is selected from organic high-molecule polymers, such as PI, having a thickness of 400 nm-800 nm; and further, the separation layer 5 having a surface area that is smaller than a surface area of the source electrode 4 so that the separation layer 5 is insufficient to completely cover the source electrode 4 and thus allowing at least one side portion of the source electrode 4;

the drain electrode 6 is also preferably a double-layered graphene film;

the oxide semiconductor channel layer 7 is formed of a material that comprises indium oxides ($InO_x$), indium gallium zinc oxides (IGZO), or zinc oxide (ZnO), wherein the oxide semiconductor channel layer 7, as compared to a known organic semiconductor channel layer, possesses relatively high electron mobility, consistent stability for large surface area and excellent surface flatness, and is more compatible with amorphous silicon manufacturing processes, so that even a channel length, which is a thickness of the separation layer 5, is reduced to a sub-micrometer order, no short channel effect may occur;

the gate insulation layer 8 is formed of a material that comprises $Al_2O_3$;

the gate electrode 9 is formed of a material that comprises aluminum-doped zinc oxide (AZO); and the planarization layer 10 is formed of a material that comprises silicon dioxide ($SiO_2$).

It is noted that by using the double-layered graphene film to make the source electrode 4 and the drain electrode 6, graphene shows excellent electrical conductivity and bending durability so as to further improve flexibility and electrical performance of the thin-film transistor; however, graphene is relatively small in thickness and soft in material, making it difficult to form an ohmic contact with other metal signal lines, and thus, it is necessary for the separation layer 5 to expose two side portions of the source electrode 4 to allow for arrangement of a source contact electrode 41 that is made of a metallic material, such as gold (Au) on one side portion of the source electrode 4 that is distant from the oxide semiconductor channel layer 7 and to arrange a drain contact electrode 61 made of a metallic material, such as Au, on one side portion of the drain electrode 6 that is distant from the oxide semiconductor channel layer 7, so that ohmic contacts can be established with the source contact electrode 41 and the drain contact electrode 61. It is apparent that the source electrode 4 and the drain electrode 6 may be each directly formed of a metal film, so that under such an arrangement, the arrangement of the source contact electrode 41 and the drain contact electrode 61 can be omitted.

Figure 3:
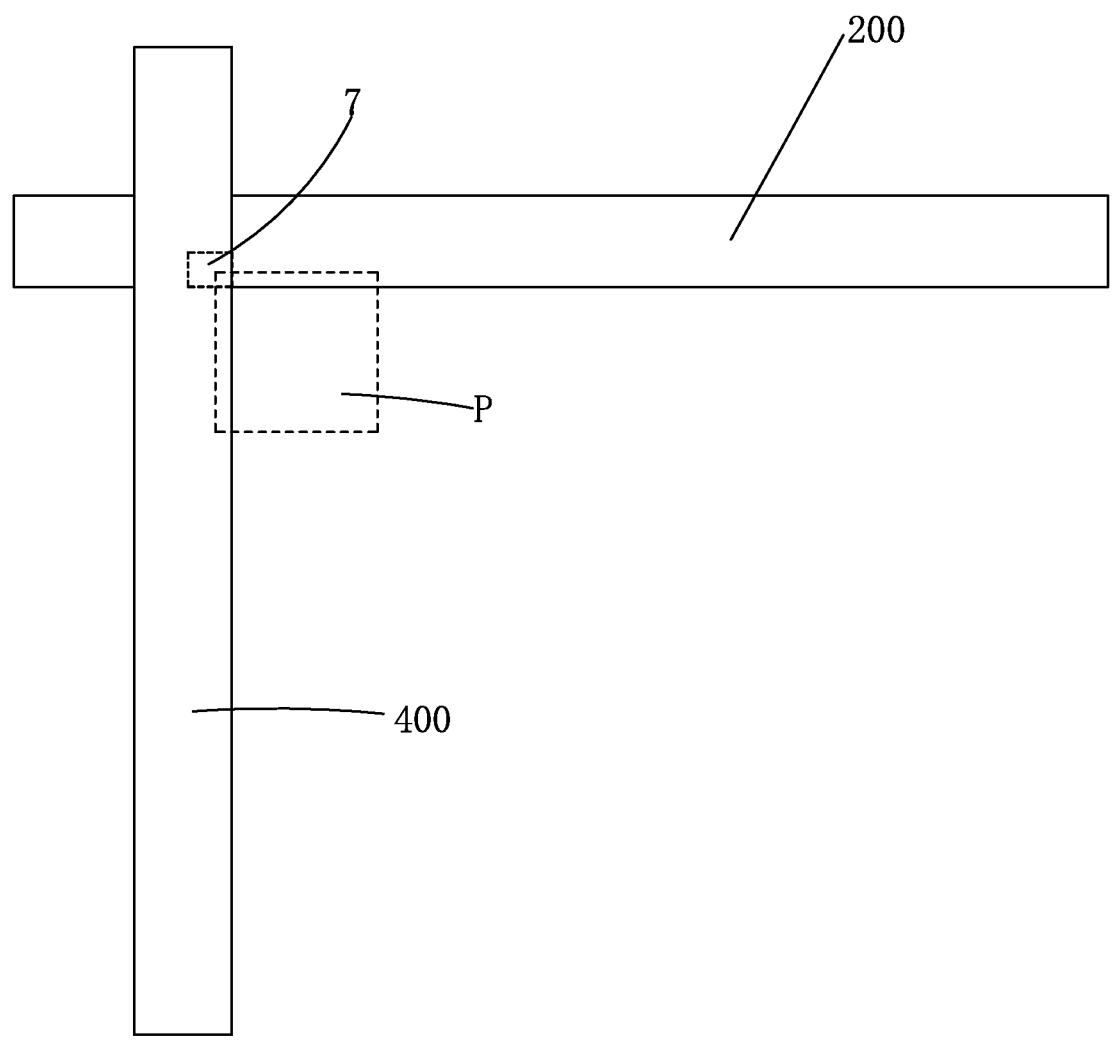
FIG. 3 is a schematic view illustrating reduction of an area of a pixel with the thin-film transistor according to the present invention.

The thin-film transistor according to the present invention is structured such that the separation layer 5 is arranged between the source electrode 4 and the drain electrode 6 and the oxide semiconductor channel layer 7 is arranged on one side of the separation layer 5 and the drain electrode 6 and sequentially contacts a portion of the upper surface of the drain electrode 6, a side surface of the drain electrode 6 and the organic separation layer 5, and a portion of the upper surface of the source electrode 4 to provide a vertical channel, wherein a channel length corresponds to a thickness of the separation layer 5, which allows for precise control, so that varying the thickness of the separation layer 5 may reduce the length of the vertical channel to a sub-micrometer order, whereby, on the one hand, significant reduction of the size of the thin-film transistor can be achieved and, on the other hand, the precise and extremely small channel length allows the thin-film transistor to gain a greater and more stable ON-state current and capable of resisting a greater bending stress. These advantages make the thin-film transistor of the present invention more suitable for applications of flexible display screens of ultra-high resolution. As shown in FIG. 3, the thin-film transistors according to the present invention can be used to make a driver array, wherein the oxide semiconductor channel layer 7, which is the vertical channel, has a relatively small overlapping area with a scan line 200 and a data line 400, the area of a pixel P can be significantly reduced, and also, the oxide semiconductor channel layer 7 that serves as the vertical channel does not cause short channel effect, allowing for improvement of the electrical performance of the thin-film transistor.

The present invention also provides an array substrate, which comprises a plurality of above-described vertical-channel thin-film transistors arranged in an array. Thus, the thin-film transistors have a relatively small size, making an area of a pixel relatively small. Repeated description of the thin-film transistor will be omitted herein. Of course, the array substrate is also provided with scan lines, data lines, and pixel electrodes and this is generally identical to the prior art so that detailed descriptions thereof will be omitted herein.

Figure 4:
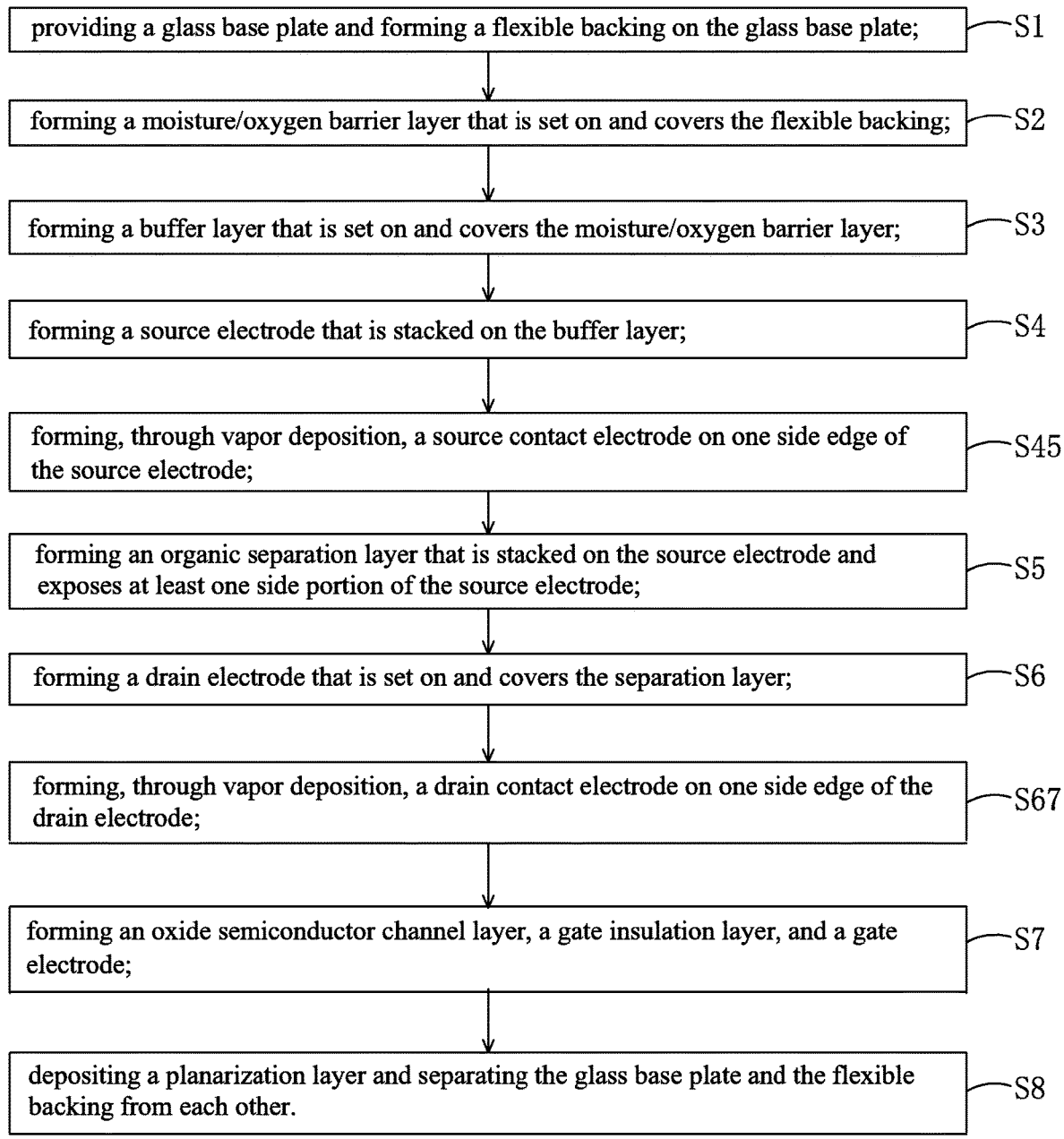
FIG. 4 is a flow chart illustrating a thin-film transistor fabrication method according to the present invention.
Figure 5:
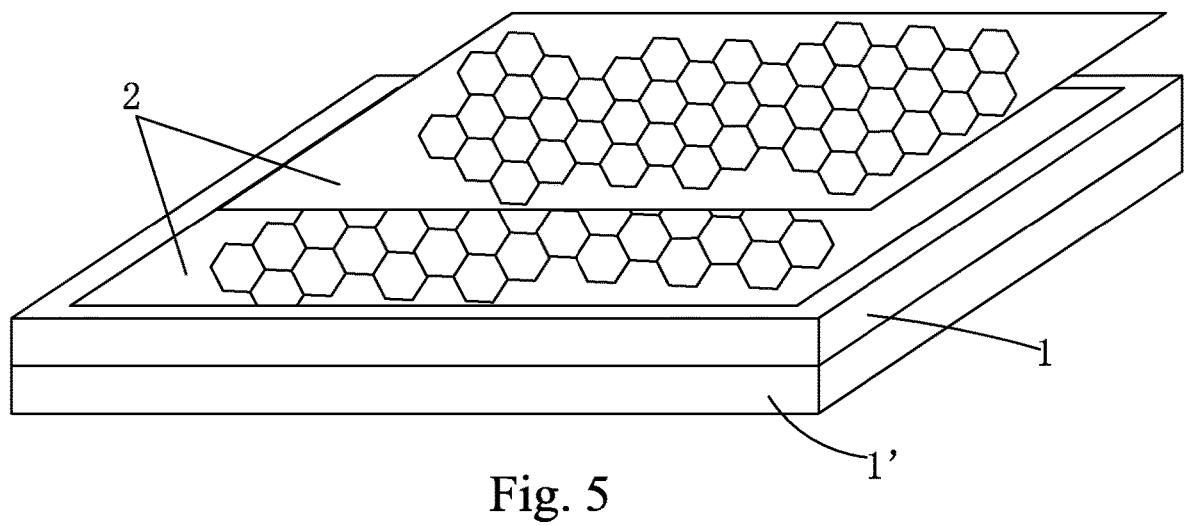
FIG. 5 is a schematic view illustrating Step S2 of the f thin-film transistor fabrication method according to the present invention.

Referring to FIG. 4, the present invention also provides a thin-film transistor fabrication method, which comprises the following steps:

Step S1: referring to FIG. 5, providing a glass base plate 1' and forming a flexible backing 1 on the glass base plate 1'.

Specifically, Step S1 involves coating and curing a PI material on the glass base plate 1' to form the flexible backing 1.

Step S2: as shown in FIG. 5, first growing an h-BN film on a copper foil with chemical vapor deposition (CVD), and then transferring the h-BN film so grown to the flexible backing 1 with a wet transfer operation so that, after repeating multiple times, a multiple-layered moisture/oxygen barrier layer 2 is formed and covers the flexible backing 1.

Specifically, the h-BN film itself shows excellent flexibility and the multiple layers of the h-BN film allows for mutual compensation of point defects so as to form a dense multiple-layered film structure that greatly improves bending durability and moisture/oxygen blocking property of the moisture/oxygen barrier layer 2.

Figure 6:
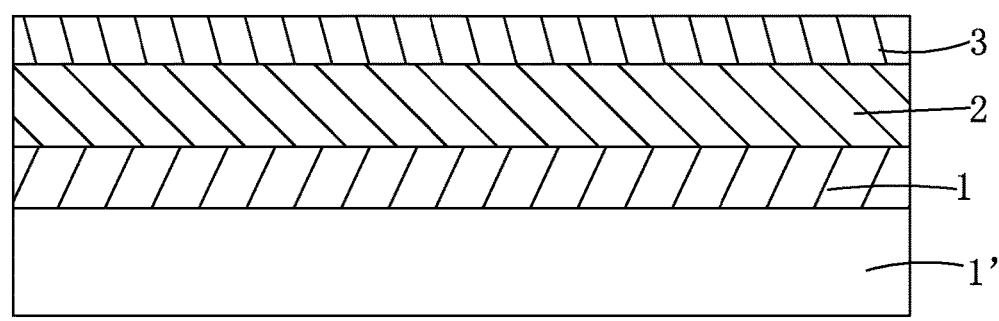
FIG. 6 is a schematic view illustrating Step S3 of the thin-film transistor fabrication method according to the present invention.

Step S3: as shown in FIG. 6, depositing an $Al_2O_3$ film on the moisture/oxygen barrier layer 2 with an atomic layer deposition operation to form a buffer layer 3 that covers the moisture/oxygen barrier layer 2.

Figure 7:
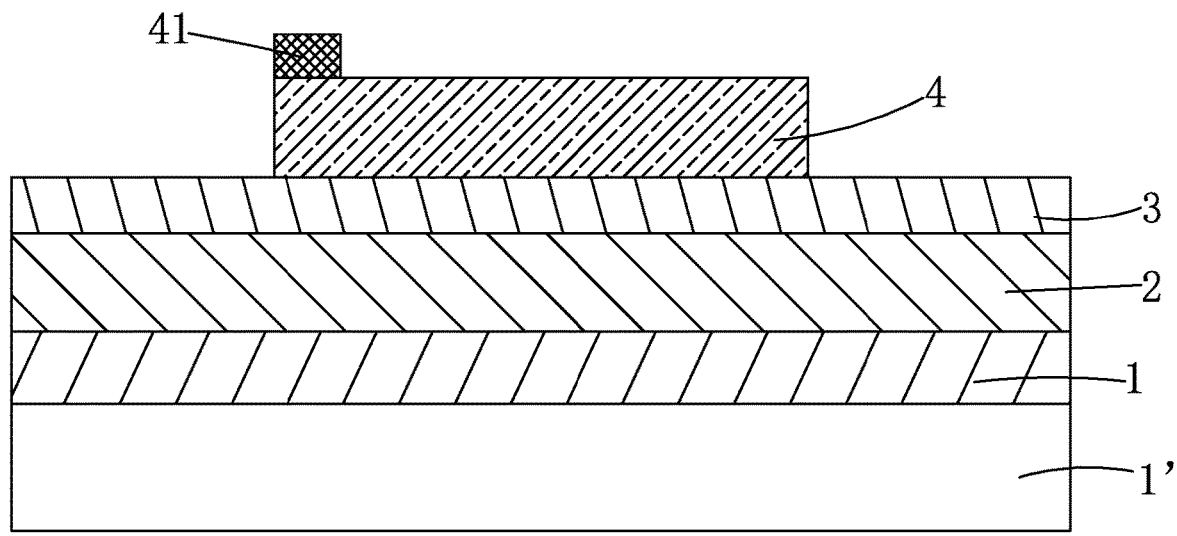
FIG. 7 is a schematic view illustrating Steps S4 and S45 of the thin-film transistor fabrication method according to the present invention.

Step S4: as shown in FIG. 7, first growing a single-layered graphene film on a copper foil with CVD, and then transferring the single-layered graphene film to the buffer layer 3 with a wet transfer operation, wherein after repeating twice, a double-layered graphene film is formed, and then, applying laser direct writing to subject the double-layered graphene film to patterning so as to form a source electrode 4 stacked on the buffer layer 3.

Graphene has high transparency and shows excellent electrical conductivity and bending durability. The source electrode 4 that is formed of the double-layered graphene film possesses excellent flexibility and electrical performance. Graphene is relatively small in thickness and soft in material, making it difficult to form an ohmic contact with other metal signal lines, and thus, it is necessary to additionally carry out Step S45, in which a source contact electrode 41 is formed, through vapor deposition, on one side portion of the source electrode 4, in order to establish ohmic contact by means of the source contact electrode 41.

Specifically, the source contact electrode 41 is formed of a material that comprises Au.

Of course, in an alternative way, the source electrode 4 is directly formed of a metal film, and Step S45 can be omitted.

Figure 8:
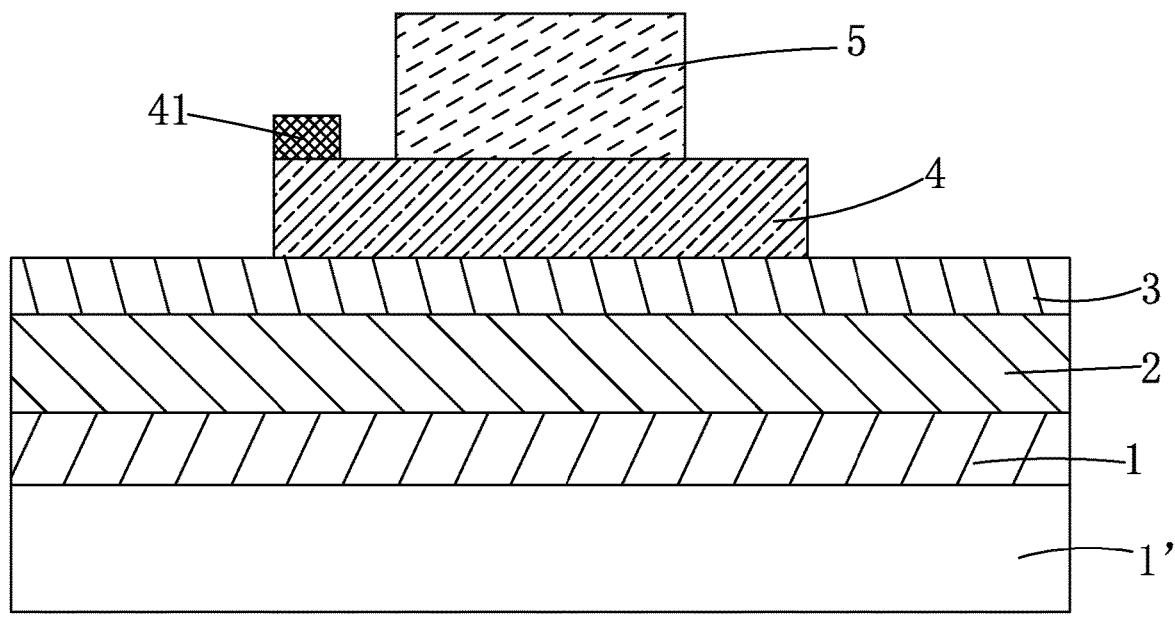
FIG. 8 is a schematic view illustrating Step S5 of the thin-film transistor fabrication method according to the present invention.

Step S5 is then carried out, wherein as shown in FIG. 8, spin coating is applied to coat a PI solution paste on each film layer after completion of Step S5, followed by drying at 150° C., exposure, and development to subsequently carry out etching with $O_2$ plasma to form a separation layer 5 that is stacked on the source electrode 4 and exposes two side portions of the source electrode 4.

Specifically, the separation layer 5 has a thickness of 400-800 nm, preferably 600 nm.

Figure 9:
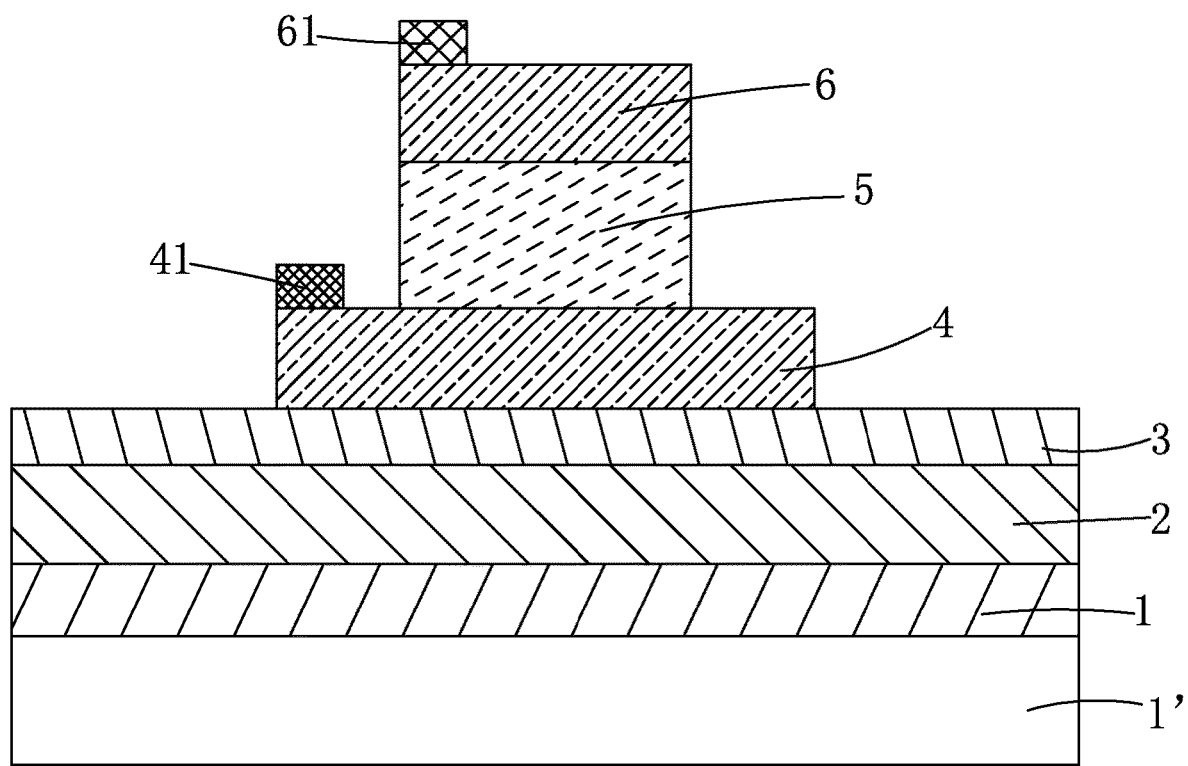
FIG. 9 is a schematic view illustrating Steps S6 and S67 of the thin-film transistor fabrication method according to the present invention.

Step S6: as shown in FIG. 9, growing a single-layered graphene film on a copper foil with CVD, and then transferring the single-layered graphene film to the separation layer 5 with a wet transfer operation, wherein after repeating twice, a double-layered graphene film is formed, and then, applying laser direct writing to subject the double-layered graphene film to patterning so as to form a drain electrode 6 that covers the separation layer 5 and has a surface area corresponding to the separation layer 5.

Graphene has high transparency and shows excellent electrical conductivity and bending durability. The drain electrode 6 that is formed of the double-layered graphene film possesses excellent flexibility and electrical performance. Graphene is relatively small in thickness and soft in material, making it difficult to form an ohmic contact with other metal signal lines, and thus, it is necessary to additionally carry out Step S67, in which a drain contact electrode 61 is formed, through vapor deposition, on one side portion of the drain electrode 6, in order to establish ohmic contact by means of the drain contact electrode 61.

Specifically, the drain contact electrode 61 is formed of a material that comprises Au.

Of course, in an alternative way, the drain electrode 6 is directly formed of a metal film, and Step S67 can be omitted.

Figure 10:
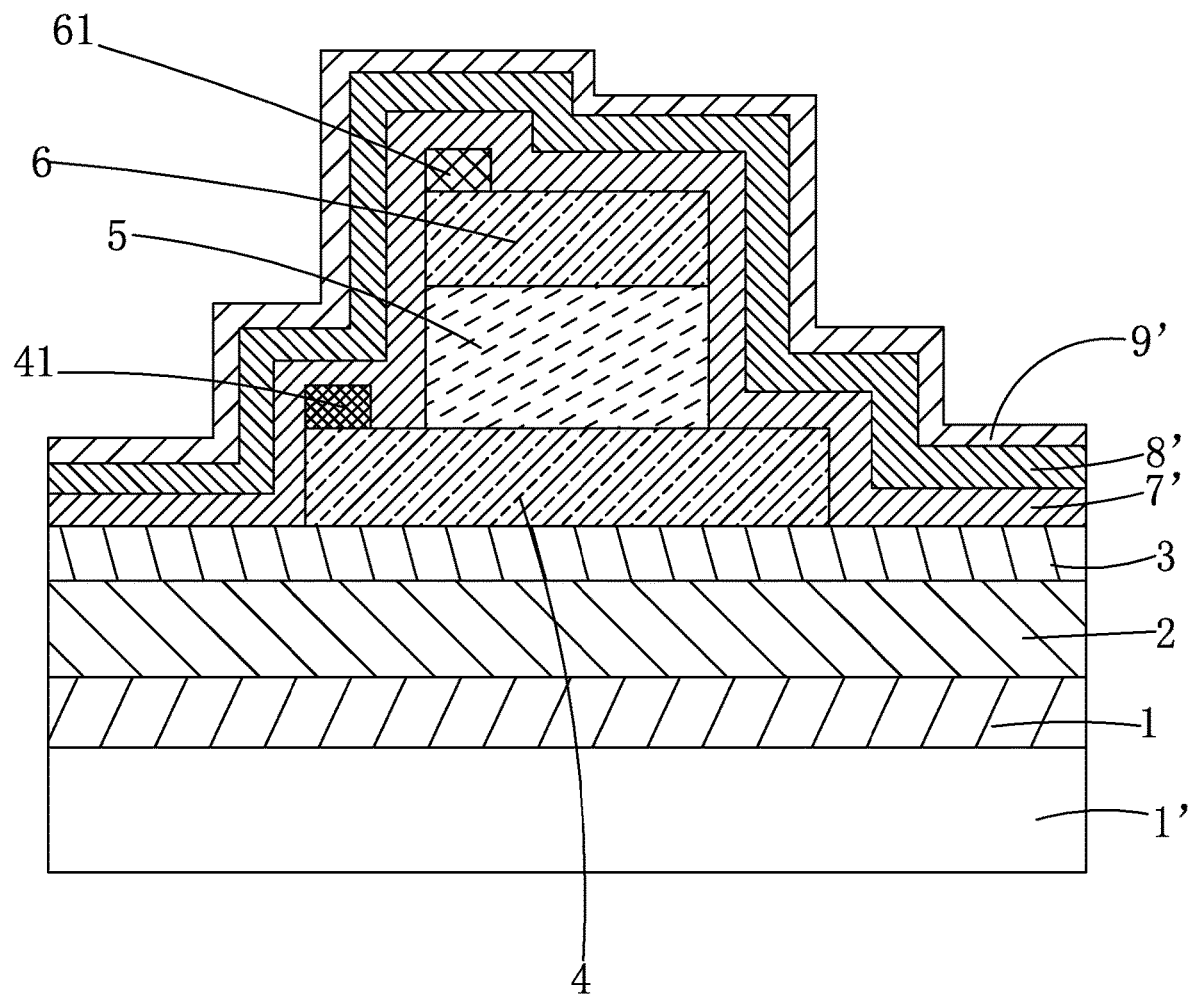
FIGS. 10 and 11 are schematic views illustrating Step S7 of the thin-film transistor fabrication method according to the present invention.
Figure 11:
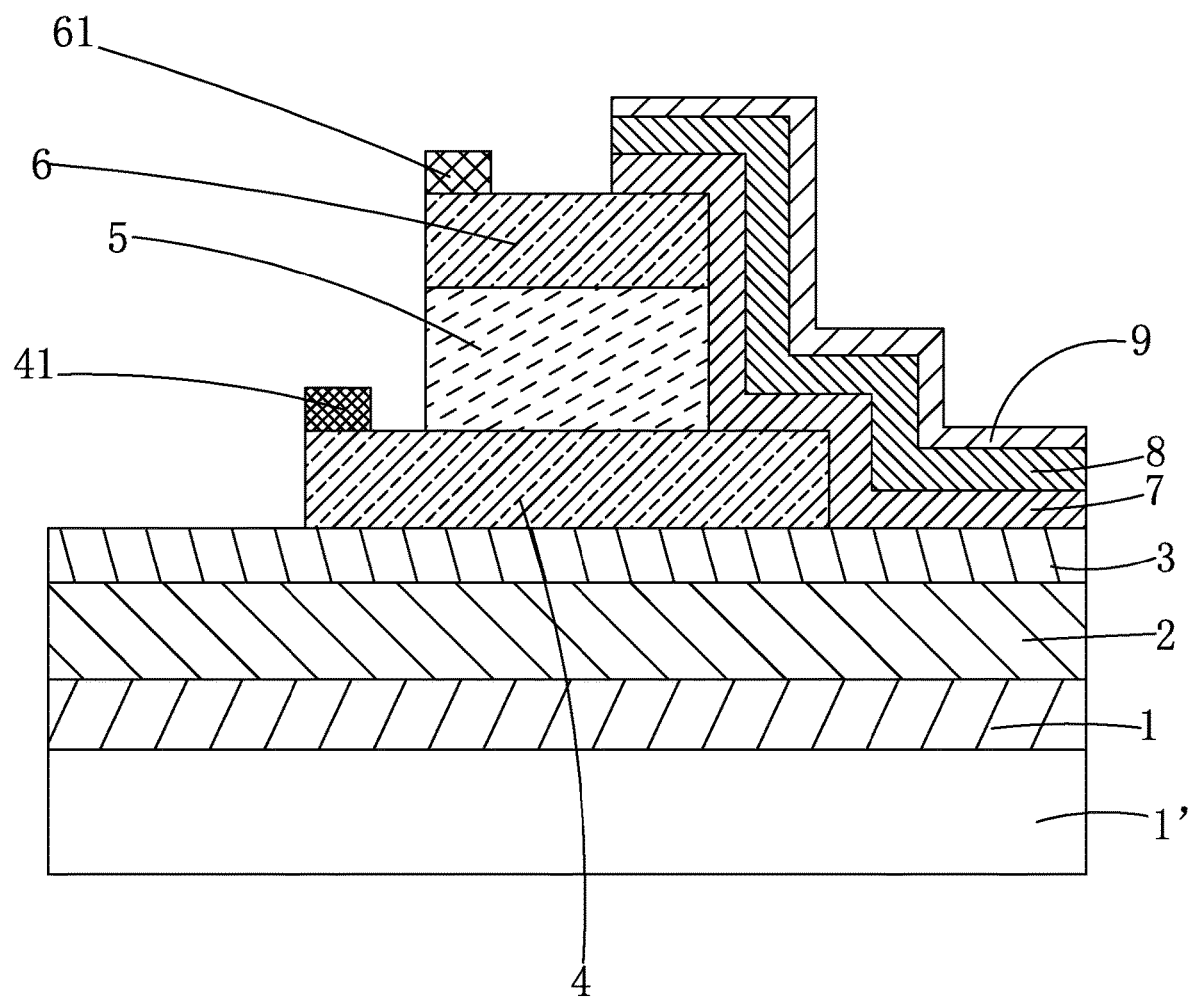

Step S7 is then carried out, wherein as shown in FIGS. 10 and 11, plasma enhanced atomic layer deposition (PEALD) is first applied to deposit, in sequence, an oxide semiconductor film 7', an insulation material film 8', and a metal film 9' on each film layer after completion of Step S6, and then, subjecting the oxide semiconductor film 7', the insulation material film 8', and the metal film 9' to patterning simultaneously with one single mask so as to form an oxide semiconductor channel layer 7, a gate insulation layer 8, and a gate electrode 9.

Specifically, the oxide semiconductor film 7' is formed of a material that comprises $InO_x$, IGZO, or ZnO; the insulation material film 8' is formed of a material that comprises $Al_2O_3$; and the metal film 9' is formed of a material that comprises AZO; and the oxide semiconductor channel layer 7 is located on one side of the organic separation layer 5 and the drain electrode 6 and is set to sequentially contact a portion of an upper surface of the drain electrode 6, a side surface of the drain electrode 6 and the organic separation layer 5, and a portion of an upper surface of the source electrode 4; the gate insulation layer 8 is set on and covers the oxide semiconductor channel layer 7 and corresponds, in shape, to the oxide semiconductor channel layer 7; and the gate electrode 9 is set on and covers the gate insulation layer 8 and corresponds, in shape, to the oxide semiconductor channel layer 7.

It is noted that Step S7 applies PEALD to deposit the oxide semiconductor film 7', the insulation material film 8', and the metal film 9', and thus, the oxide semiconductor channel layer 7, the gate insulation layer 8, and the gate electrode 9 show good step coverage, wherein the oxide semiconductor channel layer 7 provides a vertical channel, of which a channel length corresponds to a thickness of the organic separation layer 5, which allows for precise control. Further, the oxide semiconductor channel layer 7, as compared to a known organic semiconductor channel layer, possesses relatively high electron mobility, consistent stability for large surface area and excellent surface flatness, and is more compatible with amorphous silicon manufacturing processes, so that even a channel length, which is the thickness of the organic separation layer 5, is reduced to a sub-micrometer order, no short channel effect may occur, whereby, on the one hand, the size of the finally formed thin-film transistor can be significantly reduced to thereby significantly reduce an area of a pixel, and on the other hand, the electrical performance of the thin-film transistor can be significantly improved.

And, Step S8: referring to FIG. 2, depositing a planarization layer 10 on each film layer after completion of Step S7 and applying laser separation to separate the glass base plate 1' and the flexible backing 1 from each other to form a flexible, self-supporting vertical-channel thin-film transistor.

With the above thin-film transistor fabrication method, a vertical-channel thin-film transistor can be made to thereby significantly reduce the size of a thin-film transistor and reduce an area of a pixel and improve electrical characteristics and bending durability of the thin-film transistor. In addition, one single mask is used to simultaneously form the oxide semiconductor channel layer 7, the gate insulation layer 8, and the gate electrode 9, so that complication of the fabrication process is reduced.

In summary, the thin-film transistor according to the present invention is structured such that a separation layer is arranged between a source electrode and a drain electrode and an oxide semiconductor channel layer is arranged on one side of the separation layer and the drain electrode and sequentially contacts a portion of the upper surface of the drain electrode, a side surface of the drain electrode and the organic separation layer, and a portion of the upper surface of the source electrode to provide a vertical channel, wherein a channel length corresponds to a thickness of the separation layer, so that varying the thickness of the separation layer may reduce the length of the vertical channel to a submicrometer order to thereby significantly reduce the size of the thin-film transistor. Since the vertical channel has a relatively small overlapping area with a scan line and a data line, the area of a pixel can be reduced. The vertical channel does not cause short channel effect, allowing for improvement of the electrical performance of the thin-film transistor. Using a multiple-layered hexagonal boron nitride film to make a moisture/oxygen barrier layer and using a double-layered graphene film to make the source electrode and the drain electrode, bending durability of the thin-film transistor can be improved. The thin-film transistor fabrication method according to the present invention may be implemented to make the above vertical-channel thin-film transistor, so as to significantly reduce the size of the thin-film transistor, reduce an area of a pixel, improve electrical characteristics and bending durability of the thin-film transistor. In addition, one single mask is used to simultaneously form the oxide semiconductor channel layer, the gate insulation layer, and the gate electrode, so that complication of the fabrication process is reduced. The array substrate according to the present invention comprises a plurality of above-described vertical-channel thin-film transistors arranged in an array and has a relatively small size, making an area of a pixel relatively small.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A thin-film transistor fabrication method, comprising the following steps:
    Step S1: providing a glass base plate and forming a flexible backing on the glass base plate;
    Step S2: forming a moisture/oxygen barrier layer that is set on and covers the flexible backing;
    Step S3: forming a buffer layer that is set on and covers the moisture/oxygen barrier layer;
    Step S4: forming a source electrode that is stacked on the buffer layer;
    Step S5: forming a separation layer that is stacked on the source electrode and exposes at least one side portion of the source electrode;
    Step S6: forming a drain electrode that is set on and covers the separation layer;
    Step S7: forming an oxide semiconductor channel layer, a gate insulation layer, and a gate electrode;
    wherein the oxide semiconductor channel layer is arranged on one side of the organic separation layer and the drain electrode and sequentially contacts a portion of an upper surface of the drain electrode, a side surface of the drain electrode and the organic separation layer, and a portion of an upper surface of the source electrode; the gate insulation layer is arranged on the oxide semiconductor channel layer and the gate electrode is arranged on the gate insulation layer;
    wherein:
    Step S2 comprises a process that comprises first growing a hexagonal boron nitride film on a copper foil and transferring the hexagonal boron nitride film so grown to the flexible backing, wherein the process is repeated multiple times to form the moisture/oxygen barrier layer;
    Step S4 comprises a process that comprises first growing a single-layered graphene film on a copper foil and transferring the single-layered graphene film to the buffer layer, wherein the process is repeated twice to form a double-layered graphene film, and subjecting the double-layered graphene film to patterning to form the source electrode; and
    Step S6 comprises a process that comprises first growing a single-layered graphene film on a copper foil and transferring the single-layered graphene film to the separation layer, wherein the process is repeated twice to form a double-layered graphene film, and subjecting the double-layered graphene film to patterning to form the drain electrode.

2. The thin-film transistor fabrication method as claimed in claim 1, wherein
    Step S7 comprises a process that comprises first depositing an oxide semiconductor film, an insulation material film, and a metal film on the layers that have been formed at completion of Step S6, and subjecting the oxide semiconductor film, the insulation material film, and the metal film to patterning with one single mask so as to form the oxide semiconductor channel layer, the gate insulation layer, and the gate electrode that correspond in shape to each other.

3. The thin-film transistor fabrication method as claimed in claim 1 further comprising:
    Step S45, which is carried out between Step S4 and Step S5 to form, through vapor deposition, the source contact electrode on the one side portion of the source electrode;
    Step S67, which is carried out between Step S6 and Step S7 to form, through vapor deposition, the drain contact electrode on the side portion of the drain electrode; and
    Step S8, which deposits a planarization layer on the layers that have been formed at completion of Step S7 and separates the glass base plate and the flexible backing from each other.

* * * * *